(12) United States Patent
Lilje

(10) Patent No.: US 10,191,519 B2
(45) Date of Patent: Jan. 29, 2019

(54) ELECTRONIC DEVICE WITH GASKET SEALING RECEPTACLE FOR TONGUE

(71) Applicant: Google Inc., Mountain View, CA (US)

(72) Inventor: Joshua Norman Lilje, San Jose, CA (US)

(73) Assignee: GOOGLE LLC, Mountain View, CA (US)

( * ) Notice: Subject to any disclaimer, the term of this patent is extended or adjusted under 35 U.S.C. 154(b) by 0 days.

(21) Appl. No.: 15/269,007

(22) Filed: Sep. 19, 2016

(65) Prior Publication Data

US 2018/0081408 A1    Mar. 22, 2018

(51) Int. Cl.
| | |
|---|---|
| G06F 1/16 | (2006.01) |
| G06F 1/18 | (2006.01) |
| H01R 13/52 | (2006.01) |
| H05K 5/06 | (2006.01) |
| H05K 9/00 | (2006.01) |
| H01R 12/70 | (2011.01) |
| H01R 24/60 | (2011.01) |
| H01R 24/76 | (2011.01) |
| H01R 107/00 | (2006.01) |

(52) U.S. Cl.
CPC ............... *G06F 1/182* (2013.01); *G06F 1/16* (2013.01); *G06F 1/1601* (2013.01); *H01R 12/7076* (2013.01); *H01R 13/52* (2013.01); *H01R 13/521* (2013.01); *H01R 24/60* (2013.01); *H01R 24/76* (2013.01); *H05K 5/069* (2013.01); *H05K 9/0015* (2013.01); *H01R 2107/00* (2013.01)

(58) Field of Classification Search
CPC ...... G06F 1/182; H01R 13/52; H01R 13/5202
See application file for complete search history.

(56) References Cited

U.S. PATENT DOCUMENTS

| | | | |
|---|---|---|---|
| 3,982,320 A | 9/1976 | Buchoff | |
| 4,898,689 A * | 2/1990 | Hamada | ................ C08K 3/04 252/510 |
| 5,107,070 A * | 4/1992 | Benn, Sr. | ............... F16J 15/064 174/354 |

(Continued)

FOREIGN PATENT DOCUMENTS

| | | |
|---|---|---|
| CN | 202262176 U | 5/2012 |
| CN | 105449434 A | 3/2016 |

OTHER PUBLICATIONS

IFIXIT, "MacBook Air 13"0 Early 2015 Teardown", retrieved on Jul. 26, 2016 from https://www.fixit.com/Teardown/MacBook+Air+13-Inch+Early+2015+Teardown/38266, 7 pages.

(Continued)

*Primary Examiner* — Anthony Q Edwards
(74) *Attorney, Agent, or Firm* — Brake Hughes Bellermann LLP

(57) ABSTRACT

An electronic device may comprise a chassis, a tongue, and a gasket. The chassis may enclose electronic components, and may define a receptacle. The tongue may extend through the receptacle, and may comprise at least one electrical contact. The gasket may surround the tongue and be located inside the receptacle. The gasket may be non-porous and compressible. A first side of the gasket may be in continuous contact with the tongue. A second side of the gasket may be in continuous contact with the chassis.

19 Claims, 6 Drawing Sheets

(56) References Cited

U.S. PATENT DOCUMENTS

| | | | |
|---|---|---|---|
| 5,164,880 A | 11/1992 | Cronin | |
| 5,317,105 A | 5/1994 | Weber | |
| 5,847,317 A * | 12/1998 | Phelps | H05K 9/0015 174/368 |
| 6,902,688 B2 * | 6/2005 | Narayan | C08K 9/02 252/512 |
| 7,129,421 B2 * | 10/2006 | Reis | H05K 9/0015 174/354 |
| 7,249,954 B2 | 7/2007 | Weiss | |
| 7,589,284 B2 * | 9/2009 | Severance | H05K 9/0015 174/358 |
| 7,988,460 B1 | 8/2011 | Chiu | |
| 7,994,434 B2 * | 8/2011 | Benner | H05K 9/0018 174/360 |
| 8,077,578 B2 * | 12/2011 | Tsuchida | G11B 33/08 369/69 |
| 8,461,455 B2 * | 6/2013 | Kim | H01R 13/2414 174/126.2 |
| 9,063,700 B2 * | 6/2015 | Gilbert | G06F 1/1656 |
| 9,119,285 B2 * | 8/2015 | Tarkington | H05K 9/00 |
| 9,478,998 B1 * | 10/2016 | Lapetina | H02J 7/0042 |
| 9,553,410 B2 * | 1/2017 | Zhao | H01R 13/6581 |
| 9,634,425 B1 * | 4/2017 | Hsu | H01R 13/5202 |
| 9,761,988 B1 * | 9/2017 | Lin | H01R 13/521 |
| 9,876,319 B2 * | 1/2018 | Zhao | H01R 13/6596 |
| 2003/0224633 A1 | 12/2003 | Weiss | |
| 2005/0167133 A1 * | 8/2005 | Aisenbrey | B29C 45/0013 174/356 |
| 2005/0167931 A1 * | 8/2005 | Aisenbrey | B29C 45/0013 277/650 |
| 2007/0049105 A1 * | 3/2007 | Szczesny | H01R 13/565 439/446 |
| 2009/0140499 A1 * | 6/2009 | Kline | F16J 15/027 277/645 |
| 2010/0248537 A1 | 9/2010 | Zhou | |
| 2011/0149545 A1 * | 6/2011 | Shiroishi | G06F 1/1616 361/816 |
| 2011/0230074 A1 | 9/2011 | Schmidt et al. | |
| 2013/0183845 A1 * | 7/2013 | Tan | H01R 13/5202 439/271 |
| 2015/0229068 A1 | 8/2015 | Wang et al. | |
| 2015/0244101 A1 * | 8/2015 | Chien | H01R 13/5202 439/271 |
| 2015/0270661 A1 * | 9/2015 | Kao | H01R 13/5202 439/271 |
| 2016/0072209 A1 | 3/2016 | Triplett et al. | |
| 2017/0149165 A1 * | 5/2017 | Tsai | H01R 13/52 |

OTHER PUBLICATIONS

International Search Report and Written Opinion for PCT Application No. PCT/US2017/052033, dated Dec. 27, 2017, 11 pages.

* cited by examiner

ELECTRONIC DEVICE WITH GASKET SEALING RECEPTACLE FOR TONGUE

TECHNICAL FIELD

This description relates to electronic devices.

BACKGROUND

Electronic devices may connect to each other via cords which carry signals. The electronic devices may include receptacles to receive plugs attached to the cords. If water enters the electronic device via the receptacle, components of the electronic device may become damaged.

SUMMARY

According to an example, an electronic device may comprise a chassis, a tongue, and a gasket. The chassis may enclose electronic components, and may define a receptacle. The tongue may extend through the receptacle, and may comprise at least one electrical contact. The gasket may surround the tongue and be located inside the receptacle. The gasket may be non-porous and compressible. A first side of the gasket may be in continuous contact with the tongue. A second side of the gasket may be in continuous contact with the chassis.

According to another example, an electronic device may comprise at least one processor, a memory device coupled to the at least one processor, a display coupled to the at least one processor, a chassis surrounding the at least one processor and the memory device and supporting the display, a tongue extending through the receptacle, a gasket surrounding the tongue and inside the receptacle. At least a portion of the chassis may be electrically conductive and may define a receptacle. The portion of the chassis defining the receptacle may be integral with portions of the chassis surrounding the at least one processor and the memory device. The tongue may comprise at least one interior electrical contact coupled to the processor and at least one exterior contact configured to couple to a plug received by the receptacle. The gasket may be non-porous, electrically conductive, and compressible. A first side of the gasket may be in continuous contact with the tongue. A second side of the gasket may be in continuous contact with the chassis. The gasket may form a watertight seal with the tongue and the chassis to prevent water from entering the electronic device beyond the receptacle. The gasket and the electrically conductive portion of the chassis defining the receptacle may form a Faraday cage around the tongue.

According to another example, a method may include surrounding at least one processor and a memory device with a chassis. The memory device may be coupled to the at least one processor. At least a portion of the chassis may be electrically conductive and may define a receptacle. The method may also include adding metal sheets to an end portion of a printed circuit board to form a tongue. The method may also include surrounding a portion of the tongue with a gasket. The gasket may be non-porous, electrically conductive, and compressible, so that a first side of the gasket is in continuous contact with the tongue. The method may also include inserting the tongue into the receptacle. The end portion may face into the electronic device and may be coupled to the at least one processor. A second portion of the gasket may be in continuous contact with the chassis. The gasket may form a watertight seal with the tongue and the chassis to prevent water from entering the electronic device beyond the receptacle. The gasket and the electrically conductive portion of the chassis may form a Faraday cage around the tongue.

The details of one or more implementations are set forth in the accompanying drawings and the description below. Other features will be apparent from the description and drawings, and from the claims.

DETAILED DESCRIPTION

Figure 1A:
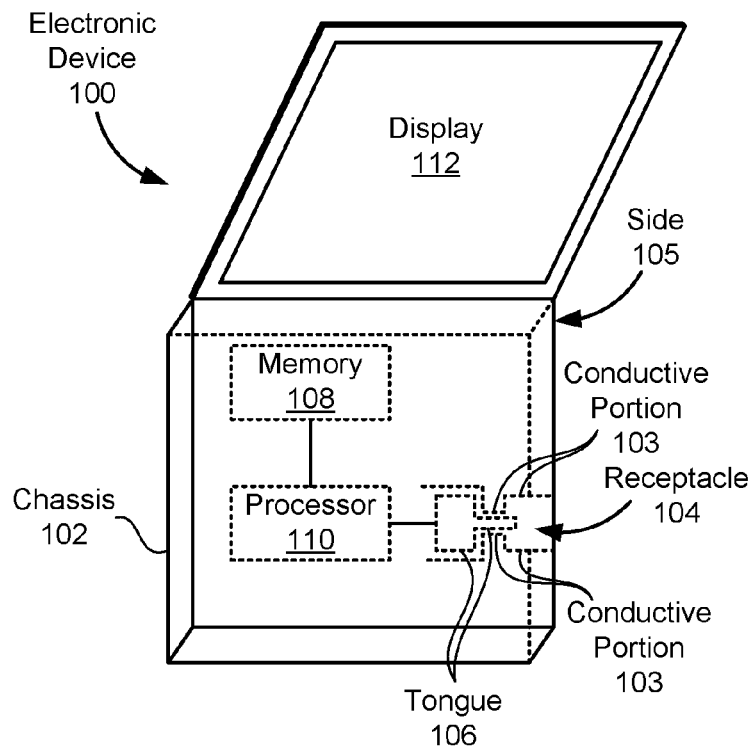
FIG. 1A is a top view of an electronic device with a chassis defining a receptacle and a tongue extending through the receptacle according to an example embodiment.

FIG. 1A is a top view of an electronic device 100 with a chassis 102 defining a receptacle 104 and a tongue 106 extending through the receptacle 104 according to an example embodiment. The electronic device 100 may communicate with other electronic devices. Electronic device 100 may communicate with other electronic devices via a cable or cord, such as a Universal Serial Bus (USB) cable, Ethernet cable, or High-Definition Multimedia Interface (HDMI) cable, as non-limiting examples. The receptacle 104 of the electronic device 100 may receive a USB plug via which the electronic device 100 may communicate with another electronic device.

The electronic device 100 may include a chassis 102. The chassis 102 may enclose components of the electronic device 100, such as a memory 108 and a processor 110, and may support a display 112 included in the electronic device 100. The processor 110 may be coupled to the memory 108 and provide instructions from the memory 108. The processor 110 may also be coupled to the display 112 and provide instructions to the display 112 to display graphical content. While the example of FIG. 1A shows the electronic device 100 as a laptop or notebook computer, the electronic device 100 may include other types of electronic devices, such as tablet computers, smartphones, netbooks, thin clients, desktop computers, or servers, as non-limiting examples.

The chassis 102 may define the receptacle 104 for receiving the plug, such as a USB plug, to communicate with another electronic device. Some or all of the chassis 102 may be electrically conductive, and an electrically conductive portion 103 of the chassis 102 may define the receptacle 104. The portion of the chassis 102 defining the receptacle 104 may be integral with, and/or made of a same single piece of metal or plastic (such as injection-molded plastic) as, the portions of the chassis 102 that surround the memory 108 and processor 110, rather than a separate receptacle component. By defining the receptacle with an integral portion of the chassis 102, rather than a separate receptacle component, the thickness of the receptacle 104 may be reduced, and the electronic device 100 may be manufactured with a thin form factor. The receptacle 104 may be defined in a side 105 of the electronic device 100 so that the cord may be plugged into the side 105 of the electronic device 100.

The electronic device 100 may include a tongue 106 extending through the receptacle 104. The tongue 106 may be received by a receptacle of the plug that enters the receptacle 104. The tongue 106 may include at least one external electrical contact for establishing electrical contact and/or communication with the plug, and may include at least one internal electrical contact coupled to the processor 110, enabling communication between the processor 110 and the other electronic device. The receptacle 104 and the tongue 106 may form a USB receptacle.

The electronic device 100 may also include one or more gaskets (shown in FIGS. 2A, 2B, and 2C) in contact with the tongue 106 and portion of the chassis 102 defining the receptacle 104. The gasket may form a watertight seal between the chassis 102 and the tongue 106, preventing water from passing through the receptacle 104 into the electronic device 100 and damaging components such as the processor 110 and memory 108. The gasket may be a solid material made of a compressible (such as having a bulk modulus of no more than one GigaPascal (1 GPa)), nonporous (such as having a porosity of two percent (2%) or lower and/or no more porous than silicon), and/or electrically conductive (such as having a conductivity of at least $10^6$ Siemens per meter) material, such as an elastomer including rubber, electrically conductive silicon (such as silicon doped with impurities to have a conductivity of at least $10^6$ Siemens per meter), or metal-impregnated silicon, or a porous foam core wrapped in metal, as non-limiting examples.

Figure 1B:
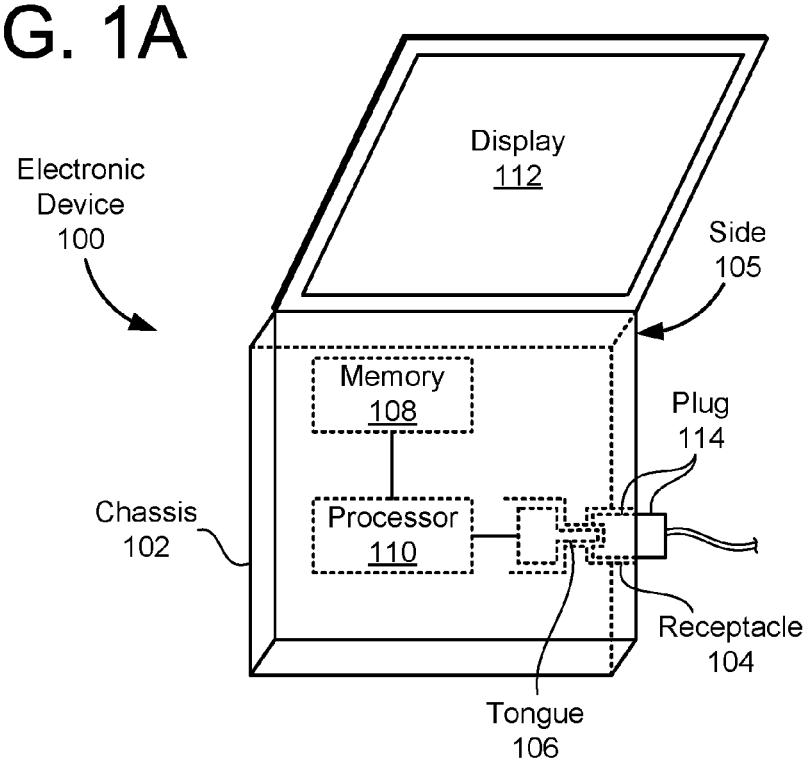
FIG. 1B is a top view of the electronic device with a plug in the receptacle according to an example embodiment.

FIG. 1B is a top view of the electronic device 100 with a plug 114 in the receptacle 104 according to an example embodiment. The receptacle 104 may receive the plug 114. The tongue 106 of the electronic device 100 may extend into a receptacle of the plug 114, establishing electrical contact with the plug 114 to enable communication between the electronic device 100 and the other electronic device.

Figure 2A:
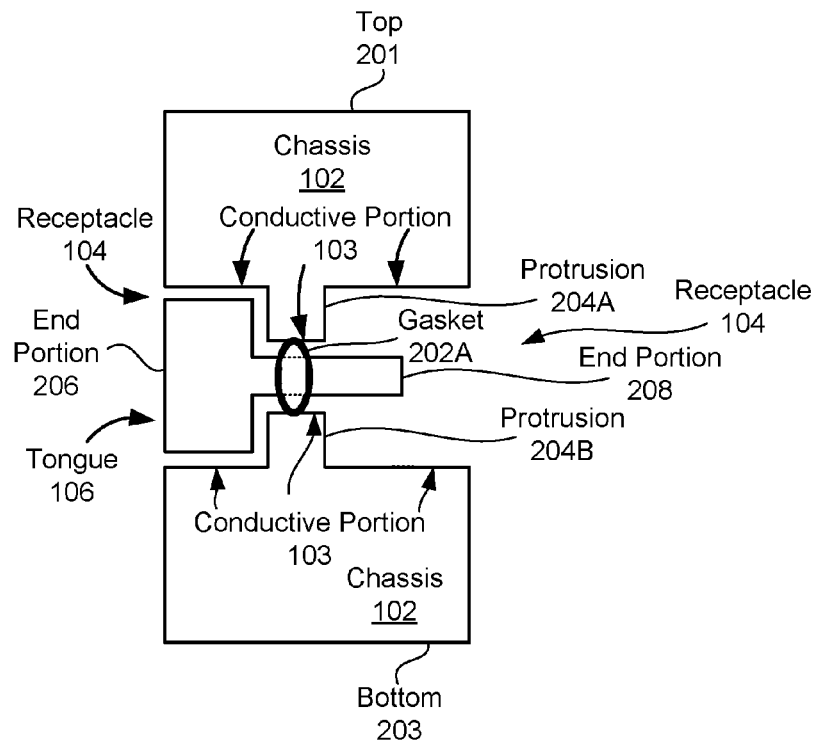
FIG. 2A is a side view of the receptacle with a gasket in contact with a protrusion and a thin portion of the tongue according to an example embodiment.

FIG. 2A is a side view of the receptacle 104 with a gasket 202A in contact with a protrusion 204A, 204B, and a thin portion of the tongue 106 according to an example embodiment. As discussed above, the chassis 102 defines the receptacle 104. The chassis 102 may also include a protrusion(s) 204A, 204B extending into the receptacle 104, narrowing a portion of the receptacle 104. The tongue 106 may include a thick portion and/or first end portion 206, and a thin portion and/or second end portion 208. The first end portion 206 of the tongue 106 may be thicker than the second end portion 208 of the tongue 106. The thin portion and/or second end portion 208 may extend through the narrow gap defined by the protrusion(s) 204A, 204B.

In the example shown in FIG. 2A, the gasket 202A surrounds the end portion 208 of the tongue 106. The gasket 202A surrounds a portion of the end portion 208 of the tongue 106 that extends between the protrusion(s) 204A, 204B. A first, or inner or interior, side of the gasket 202A, may be in continuous contact with the end portion 208 of the tongue 106, and a second, or outer or exterior, side of the gasket 202A may be in continuous contact with the protrusion(s) 204A, 204B. The continuous contact between the gasket 202A and the end portion 208 of the tongue 106 and protrusion(s) 204A, 204B may form a watertight seal, preventing water from entering the electronic device 100 via the receptacle 104. The gasket 202A may be compressed between the end portion 208 of the tongue 106 and the protrusion(s) 204A, 204B, strengthening the seal.

Figure 2B:
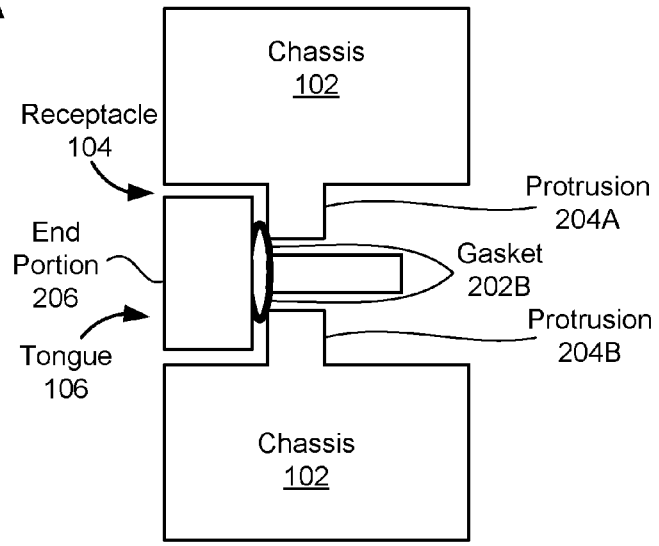
FIG. 2B is a side view of the receptacle with a gasket in contact with the protrusion and a thick portion of the tongue according to an example embodiment.

FIG. 2B is a side view of the receptacle 104 with a gasket 202B in contact with the protrusion(s) 204A, 204B and a thick portion of the tongue 106 according to an example embodiment. In this example, a first side of the gasket 202B is in continuous contact with the thick portion or first end portion 206 of the tongue 106, and a second side of the gasket 202B is in continuous contact with the protrusion(s) 204A, 204B. The continuous contact between the gasket 202B and the end portion 206 of the tongue 106 and protrusion(s) 204A, 204B may form a watertight seal, preventing water from entering the electronic device 100 via the receptacle 104. The gasket 202C may be compressed between the end portion 206 of the tongue 106 and the protrusion(s) 204A, 204B, strengthening the seal.

Figure 2C:
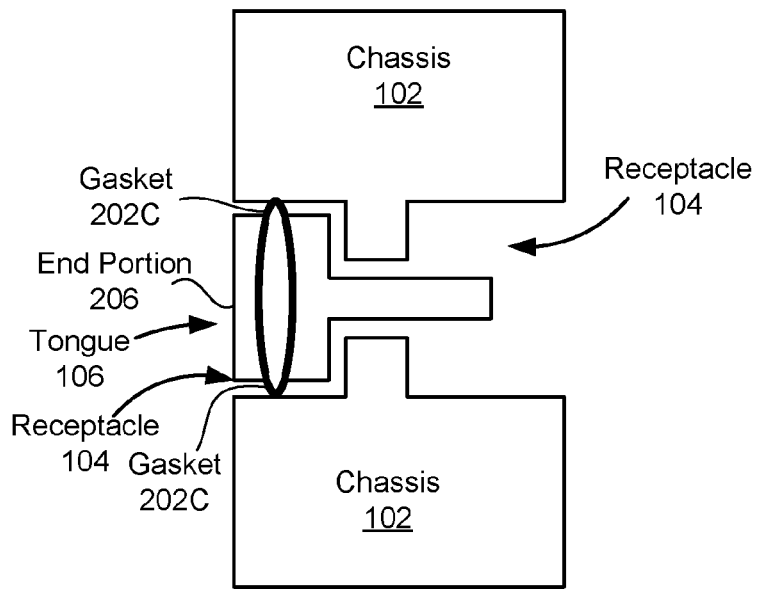
FIG. 2C is a side view of the receptacle with a gasket in contact with the thick portion of the tongue and a portion of the chassis defining the receptacle other than the protrusion according to an example embodiment.

FIG. 2C is a side view of the receptacle 104 with a gasket 202C in contact with the thick portion of the tongue 106 and a portion of the chassis 102 defining the receptacle 104 other than the protrusion according to an example embodiment. In this example, the gasket 202C surrounds the thick portion and/or first end portion 206 of the tongue 106, and a first, or inner or interior, side of the gasket 204C is in continuous contact with the thick portion or first end portion 206 of the tongue 106, and a second, or outer or exterior, side of the gasket 204C is in continuous contact with a portion of the chassis 102 defining the receptacle 104 other than the protrusion. The continuous contact between the gasket 202C and the end portion 206 of the tongue 106 and chassis 102 may form a watertight seal, preventing water from entering the electronic device 100 via the receptacle 104. The gasket 202C may be compressed between the end portion 206 of the tongue 106 and the chassis 102, strengthening the seal.

In examples in which the gasket 202A, 202B, 202C is electrically conductive, the gasket 202A, 202B, 202C and electrically conductive portion 103 of the chassis 102 may form a Faraday cage around the tongue 106, dampening noise and/or reducing electromagnetic interference (EMI), reducing signaling noise from the cable and/or plug 114 connecting the electronic device 100 to the other electronic device. The electronic device 100 may also include more than one gasket, such as the gasket 202A between the second end portion 208 and the protrusion(s) 204A, 204B and the gasket 202B between the first end portion 206 and the protrusion(s) 204A, 204B; the gasket 202A between the second end portion 208 and the protrusion(s) 204A, 204B and the gasket 202C between the first end portion 206 and the portion of the chassis 102 defining the receptacle 104 other than the protrusion; the gasket 202B between the first end portion 208 and the protrusion(s) 204A, 204B and the gasket 202C between the first end portion 206 and the portion of the chassis 102 defining the receptacle 104 other than the protrusion; or the gasket 202A between the second end portion 208 and the protrusion(s) 204A, 204B, the gasket 202B between the first end portion 206 and the protrusion(s) 204A, 204B, and the gasket 202C between the first end portion 206 and the portion of the chassis 102 defining the receptacle 104 other than the protrusion.

Figure 3:
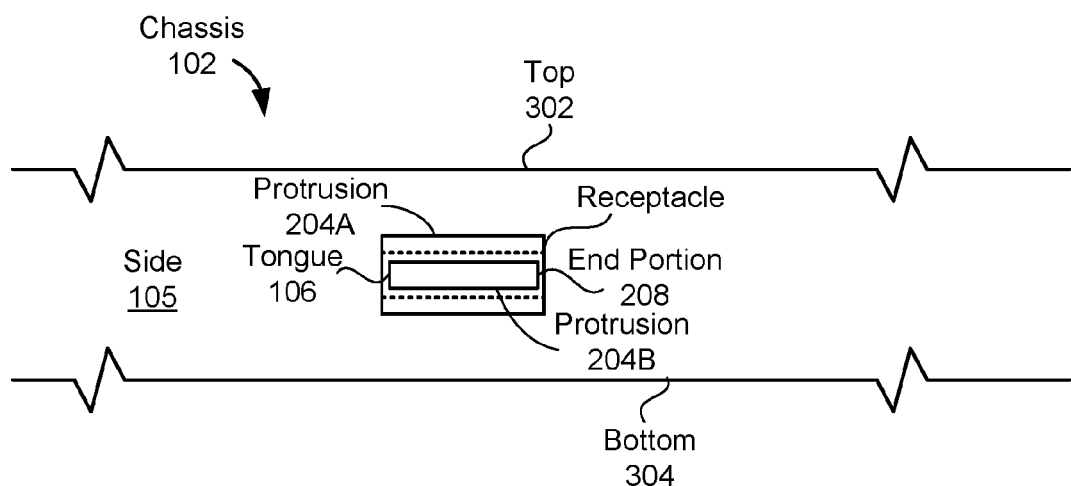
FIG. 3 is a side view of the chassis showing the receptacle according to an example embodiment.

FIG. 3 is a side view of the chassis 102 showing the receptacle 104 according to an example embodiment. As shown in FIG. 3, the chassis 102 defines the receptacle 104 in the side 105 of the chassis 102. The side 105 is a portion of the chassis 102 that connects, is adjacent to, and/or is perpendicular to, a top 302 of the chassis 102 and a bottom 304 of the chassis 102. The protrusion(s) 204A, 204B may extend into the receptacle 104. The thin portion and/or second end portion 208 of the tongue 106 may extend into and/or through the receptacle 104 between the protrusion(s) 204A, 204B.

Figure 4A:
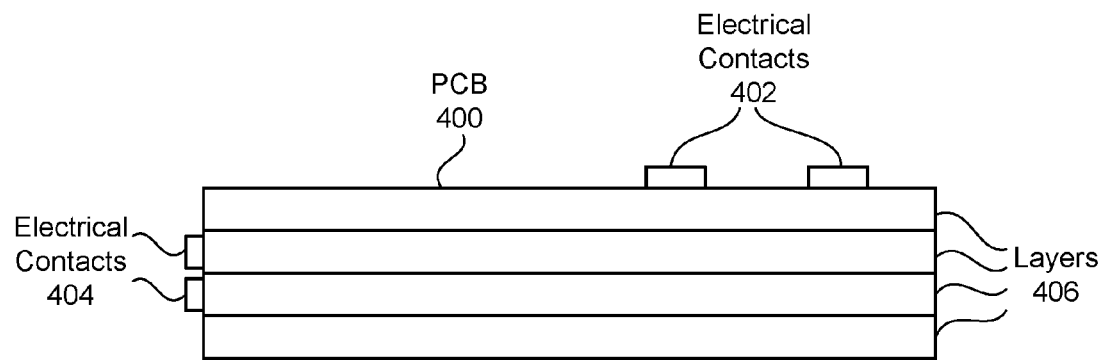
FIG. 4A is a side view of a printed circuit board (PCB) used to make the tongue according to an example embodiment.

FIG. 4A is a side view of a printed circuit board (PCB) 400 used to make the tongue 106 according to an example embodiment. The PCB 400 may include electrical contacts 402, and/or at least one exterior electrical contact, to contact electrical contacts of a plug 114 inserted into the receptacle 104. The PCB 400 may also include electrical contacts 404, and/or at least one interior electrical contact, to interface with components of the electronic device 100, such as the processor 110. The PCB 400 may include multiple layers 406 of circuitry. The circuitry in the layers 406 may enable the electrical contacts 402, 404 to communicate with each other. The PCB 400 may include flame retardant 4 (FR-4), fortified with stainless steel or nickel to prevent the FR-4 from breaking.

Figure 4B:
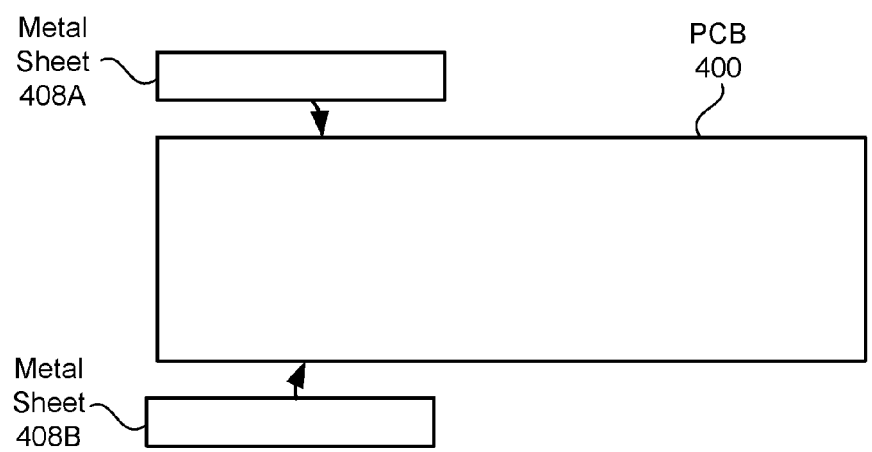
FIG. 4B is a side view of the PCB and metal sheets used to make the tongue according to an example embodiment.

FIG. 4B is a side view of the PCB 400 and metal sheets 408A, 408B used to make the tongue 106 according to an example embodiment. Metal sheets 408A, 408B, which may also be referred to as strips of sheet metal, may be attached and/or bonded, such as by soldering, to an end portion of the PCB 400 to form the thick portion and/or first end portion 206 of the tongue 106. While FIG. 4B shows one metal sheet 408A, 408B being attached to each side of the PCB 400, multiple metal sheets 408A, 408B may be attached to each side of the PCB 400, forming the tongue 106 and increasing the thickness of the first end portion 206 to hold the tongue 106 in the receptacle 104.

Figure 5:
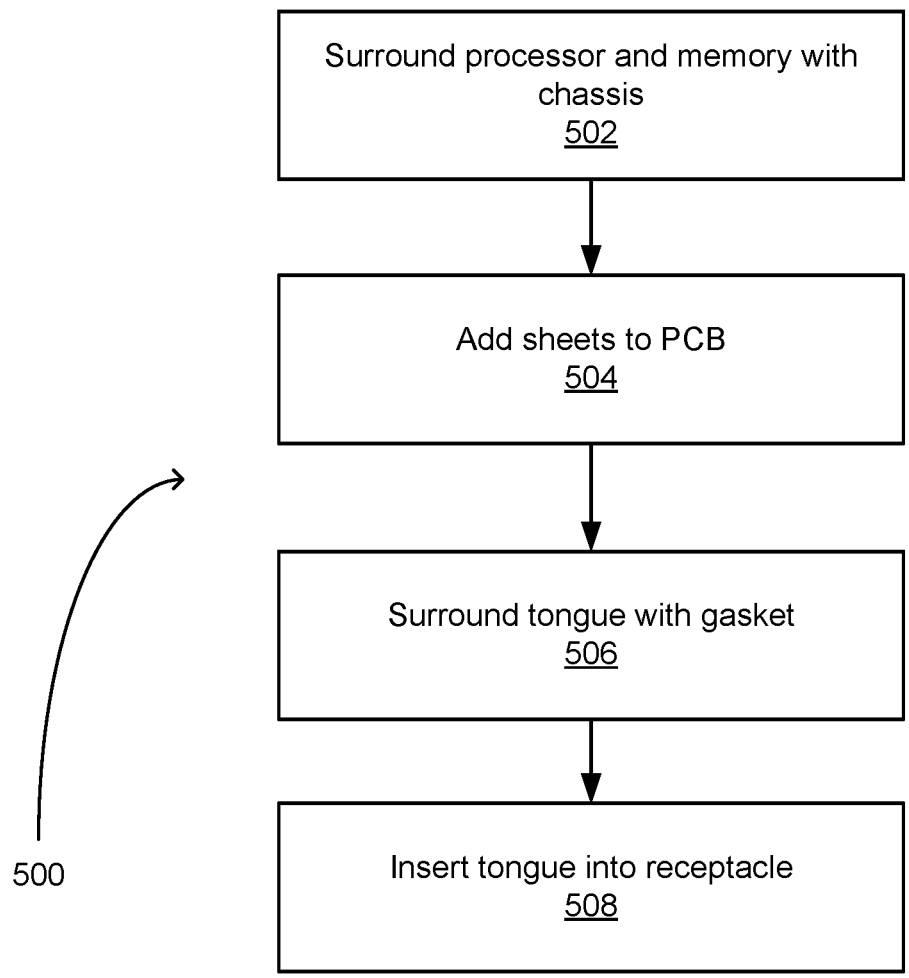
FIG. 5 is a flowchart of a method of manufacturing an electronic device according to an example embodiment.

FIG. 5 is a flowchart of a method 500 of manufacturing an electronic device 100 according to an example embodiment. According to this example, the method 500 may include surrounding at least one processor 110 and a memory device 108 with a chassis 102 (502). The memory device 108 may be coupled to the at least one processor 110. At least a portion 103 of the chassis 102 may be electrically conductive and may define a receptacle 104.

The method 500 may also include adding metal sheets 408A, 408B to an end portion 206 of a printed circuit board (PCB) 400 to form a tongue 106 (504).

The method 500 may also include surrounding a portion 206, 208 of the tongue with a gasket 202A, 202B, 202C (506). The gasket 202A, 202B, 202C may be non-porous, electrically conductive, and compressible, so that a first side of the gasket is in continuous contact with the tongue 106.

The method 500 may also include inserting the tongue 106 into the receptacle 104 (508). The end portion 206 may face into the electronic device 100 and may be coupled to the at least one processor 110. A second portion of the gasket 202A, 202B, 202C may be in continuous contact with the chassis 102. The gasket 202A, 202B, 202C may form a watertight seal with the tongue 106 and the chassis 102 to prevent water from entering the electronic device 100 beyond the receptacle 104. The gasket 202A, 202B, 202C and the electrically conductive portion 103 of the chassis 102 may form a Faraday cage around the tongue 106.

According to an example, the gasket 202A, 202B, 202C may include metal-impregnated silicon.

Figure 6:
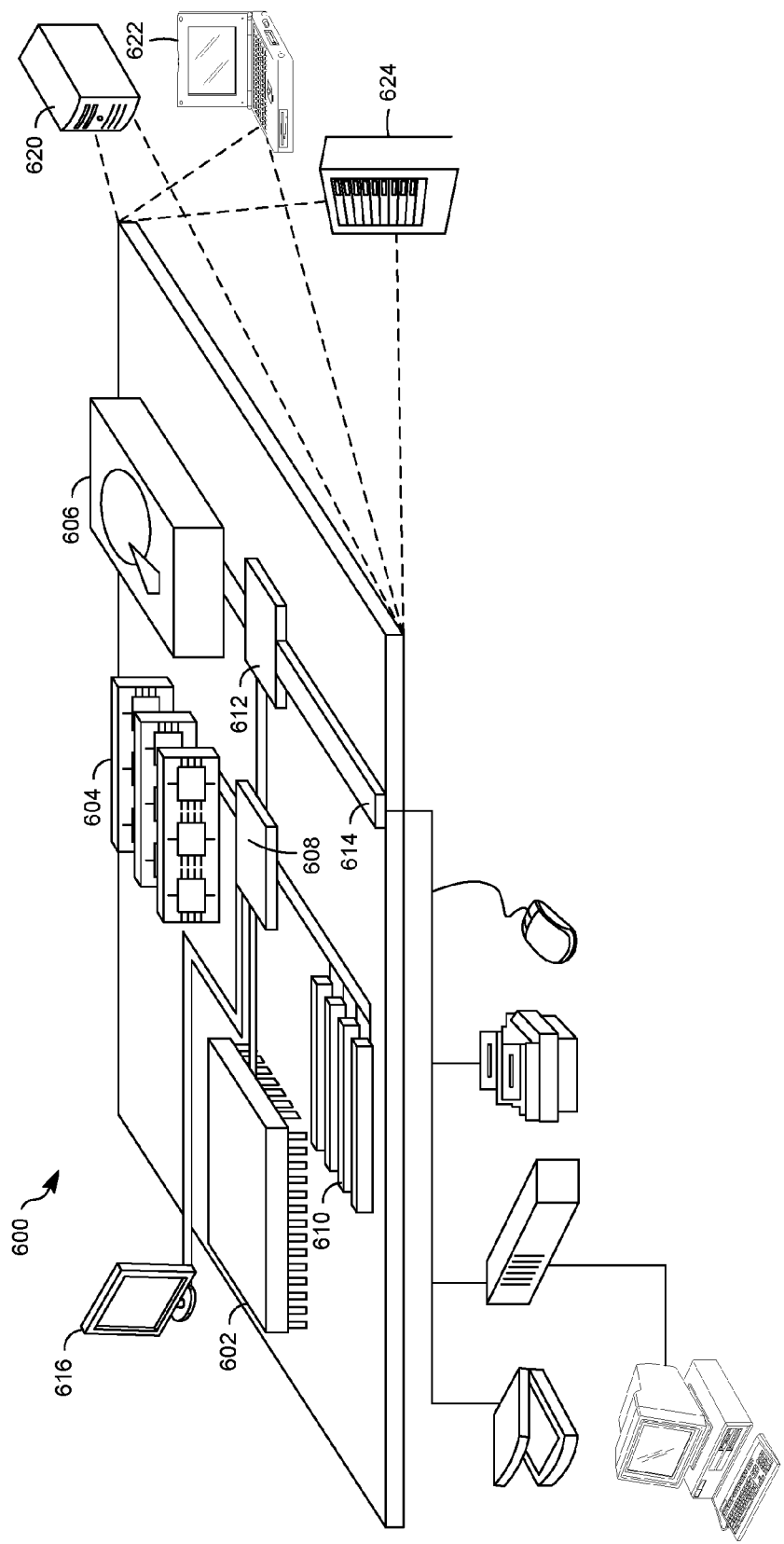
FIG. 6 shows an example of a computer that can be used to implement the techniques described here.

FIG. 6 shows an example of a generic computer device 600 which may be used with the techniques described here. Computing device 600 may be an example of the electronic device 100 and is intended to represent various forms of digital computers, such as laptops, desktops, tablets, workstations, personal digital assistants, televisions, servers, blade servers, mainframes, and other appropriate computing devices. The components shown here, their connections and relationships, and their functions, are meant to be exemplary only, and are not meant to limit implementations of the inventions described and/or claimed in this document.

Computing device 600 includes a processor 602, memory 604, a storage device 606, a high-speed interface 608 connecting to memory 604 and high-speed expansion ports 610, and a low speed interface 612 connecting to low speed bus 614 and storage device 606. The processor 602 can be a semiconductor-based processor. The memory 604 can be a semiconductor-based memory. Each of the components 602, 604, 606, 608, 610, and 612, are interconnected using various busses, and may be mounted on a common motherboard or in other manners as appropriate. The processor 602 can process instructions for execution within the computing device 600, including instructions stored in the memory 604 or on the storage device 606 to display graphical information for a GUI on an external input/output device, such as display 616 coupled to high speed interface 608. In other implementations, multiple processors and/or multiple buses may be used, as appropriate, along with multiple memories and types of memory. Also, multiple computing devices 600 may be connected, with each device providing portions of the necessary operations (e.g., as a server bank, a group of blade servers, or a multi-processor system).

The memory 604 stores information within the computing device 600. In one implementation, the memory 604 is a volatile memory unit or units. In another implementation, the memory 604 is a non-volatile memory unit or units. The memory 604 may also be another form of computer-readable medium, such as a magnetic or optical disk.

The storage device 606 is capable of providing mass storage for the computing device 600. In one implementation, the storage device 606 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 604, the storage device 606, or memory on processor 602.

The high speed controller 608 manages bandwidth-intensive operations for the computing device 600, while the low speed controller 612 manages lower bandwidth-intensive operations. Such allocation of functions is exemplary only. In one implementation, the high-speed controller 608 is coupled to memory 604, display 616 (e.g., through a graphics processor or accelerator), and to high-speed expansion ports 610, which may accept various expansion cards (not shown). In the implementation, low-speed controller 612 is coupled to storage device 606 and low-speed expansion port 614. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 600 may be implemented in a number of different forms, as shown in the figure. For example, it may be implemented as a standard server 620, or multiple times in a group of such servers. It may also be implemented as part of a rack server system 624. In addition, it may be implemented in a personal computer such as a laptop computer 622. Alternatively, components from computing device 600 may be combined with other components in a mobile device (not shown), such as device 650. Each of such devices may contain one or more of computing device 600, 650, and an entire system may be made up of multiple computing devices 600, 650 communicating with each other.

A number of embodiments have been described. Nevertheless, it will be understood that various modifications may be made without departing from the spirit and scope of the invention. Accordingly, other embodiments are within the scope of the following claims.

What is claimed is:

1. An electronic device comprising:
   a chassis enclosing electronic components, the chassis defining a receptacle and including a protrusion extending into the receptacle;
   a tongue extending through the receptacle, the tongue comprising a thick portion, a thin portion extending from the thick portion and adjacent to the protrusion, and at least one electrical contact on at least one of the trick portion and the thin portion; and
   a gasket surrounding the tongue and inside the receptacle, the gasket being non-porous and compressible, a first side of the gasket being in continuous contact with the tongue, a second side of the gasket being in continuous contact with the chassis.

2. The electronic device of claim 1, wherein the gasket is electrically conductive.

3. The electronic device of claim 2, wherein a portion of the chassis defining the receptacle is electrically conductive.

4. The electronic device of claim 3, wherein the gasket and the portion of the chassis defining the receptacle form a Faraday cage surrounding the tongue.

5. The electronic device of claim 1, wherein the gasket includes rubber.

6. The electronic device of claim 1, wherein the gasket includes electrically conductive silicon.

7. The electronic device of claim 1, wherein the gasket includes metal-impregnated silicon.

8. The electronic device of claim 1, wherein the gasket includes a porous foam core wrapped in metal.

9. The electronic device of claim 1, wherein the continuous contact of the gasket with the tongue and the chassis forms a watertight seal preventing water from entering the electronic device.

10. The electronic device of claim 1, wherein the first side of the gasket includes an interior side of the gasket and the second side of the gasket includes an exterior side of the gasket.

11. The electronic device of claim 1, wherein the first side of the gasket is in continuous contact with the thin portion of the tongue and the second side of the gasket is in continuous contact with the protrusion.

12. The electronic device of claim 1, wherein the first side of the gasket is in continuous contact with the thick portion of the tongue and the second side of the gasket is in continuous contact with the protrusion.

13. The electronic device of claim 1, wherein the first side of the gasket is in continuous contact with the thick portion of the tongue and the second side of the gasket is in continuous contact with a portion of the chassis defining the receptacle other than the protrusion.

14. The electronic device of claim 1, wherein the tongue includes a printed circuit board (PCB) and metal bonded onto an end portion of the tongue.

15. The electronic device of claim 1, wherein the receptacle and the tongue form a Universal Serial Bus (USB) receptacle.

16. An electronic device comprising:
    at least one processor;
    a memory device coupled to the at least one processor;
    a display coupled to the at least one processor;
    a chassis surrounding the at least one processor and the memory device and supporting the display, at least a portion of the chassis being electrically conductive and defining a receptacle, the portion of the chassis defining the receptacle being integral with portions of the chassis surrounding the at least one processor and the memory device, the chassis including a protrusion extending into the receptacle;
    a tongue extending through the receptacle, the tongue comprising at least one interior electrical contact coupled to the processor, at least one exterior contact configured to couple to a plug received by the receptacle, a thick portion, and a thin portion extending from the thick portion, the thin portion being adjacent to the protrusion; and
    a gasket surrounding the tongue and inside the receptacle, the gasket being non-porous, electrically conductive, and compressible, a first side of the gasket being in continuous contact with the tongue, a second side of the gasket being in continuous contact with the chassis, the gasket forming a watertight seal with the tongue and the chassis to prevent water from entering the electronic device beyond the receptacle, the gasket and the electrically conductive portion of the chassis defining the receptacle forming a Faraday cage around the tongue.

17. The electronic device of claim 16, wherein the receptacle and the tongue form a Universal Serial Bus (USB) receptacle.

18. A method of manufacturing an electronic device, the method comprising:
    surrounding at least one processor and a memory device with a chassis, the memory device being coupled to the at least one processor, at least a portion of the chassis being electrically conductive and defining a receptacle, the chassis including a protrusion extending into the receptacle;
    adding metal sheets to an end portion of a printed circuit board (PCB) to form a tongue, the tongue including a thick portion and a thin portion extending from the thick portion, the thin portion being adjacent to the protrusion;
    surrounding at least one of the thick portion and the thin portion of the tongue with a gasket, the gasket being non-porous, electrically conductive, and compressible, so that a first side of the gasket is in continuous contact with the tongue; and
    inserting the tongue into the receptacle, the end portion of the PCB facing into the electronic device and being coupled to the at least one processor, a second portion of the gasket being in continuous contact with the chassis, the gasket forming a watertight seal with the tongue and the chassis to prevent water from entering the electronic device beyond the receptacle, the gasket and the electrically conductive portion of the chassis forming a Faraday cage around the tongue.

19. The method of claim 18, wherein the gasket includes metal-impregnated silicon.

\* \* \* \* \*

UNITED STATES PATENT AND TRADEMARK OFFICE
CERTIFICATE OF CORRECTION

PATENT NO. : 10,191,519 B2
APPLICATION NO. : 15/269007
DATED : January 29, 2019
INVENTOR(S) : Lilje Page 1 of 1

It is certified that error appears in the above-identified patent and that said Letters Patent is hereby corrected as shown below:

In the Claims

In Column 7, Claim 1, Line 31, delete "trick" and insert -- thick --, therefor.

Signed and Sealed this
Eighth Day of October, 2019

Andrei Iancu
*Director of the United States Patent and Trademark Office*